United States Patent
Sreerama et al.

(10) Patent No.: US 8,611,478 B2
(45) Date of Patent: Dec. 17, 2013

(54) DYNAMIC RFI MITIGATION

(75) Inventors: Chaitanya Sreerama, Hillsboro, OR (US); Keith R. Tinsley, Beaverton, OR (US); Harry G. Skinner, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 975 days.

(21) Appl. No.: 12/317,024

(22) Filed: Dec. 18, 2008

(65) Prior Publication Data

US 2010/0158169 A1 Jun. 24, 2010

(51) Int. Cl.
*H03D 1/04* (2006.01)

(52) U.S. Cl.
USPC .......................................................... 375/346

(58) Field of Classification Search
USPC ........... 375/285, 346; 455/296, 1, 63.1, 114.2
See application file for complete search history.

(56) References Cited

U.S. PATENT DOCUMENTS

2003/0198307 A1* 10/2003 Neill et al. ..................... 375/346
2008/0081586 A1* 4/2008 Sreerama et al. ............. 455/255

* cited by examiner

*Primary Examiner* — Sam K Ahn
*Assistant Examiner* — Vineeta Panwalkar
(74) *Attorney, Agent, or Firm* — International IP Law Group, P.L.L.C.

(57) ABSTRACT

Provided herein are different embodiments for performing radio frequency interference (RFI) mitigation in electronic devices such as mobile computing systems. In some embodiments, a dynamic RFI mitigation scheme allows for monitoring of wireless channels for RFI and to adaptively shift an identified RFI source (e.g., system clock) harmonics, e.g., either out of the on-channels or to a neutral position within the on-channels such as by using cost-function analysis.

20 Claims, 6 Drawing Sheets

DYNAMIC RFI MITIGATION

BACKGROUND

The present invention relates generally to computer platforms and in particular, to approaches for mitigating against radio frequency (RF) interference for enhancing wireless communications.

In many platforms with wireless communication capabilities (e.g., WAN and WiFi/WiMax), there may be throughput performance degradation, a result of RFI (radio frequency interference). RFI may come from many sources including computing platform RFI sources such as system clocks and data strobes. Unfortunately, mitigating RFI, e.g., due to RFI sources over multiple RF bands can be complex. For example, conventional approaches such as open-loop adaptive clocking algorithms are typically static approaches that drive the decision making only based on the input information and predetermined analysis which, may or may not be advantageous at all times. The precursors also have difficulty dealing with multiple radio bands operating simultaneously over a limited solution space due to sub-harmonics and hence may end up being not reliable over all operating environments and can result in systems crashing or becoming unstable. Accordingly, improved solutions may be desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Provided herein are different embodiments for performing radio frequency interference (RFI) mitigation in electronic devices such as mobile computing systems. In some embodiments, a dynamic RFI mitigation scheme allows for monitoring of wireless channels for RFI and to adaptively shift an identified RFI source (e.g., system clock) harmonics, e.g., either out of the on-channels or to a neutral position within the on-channels such as by using cost-function analysis.

With many electronic devices such as computers with a wireless network interface, real-time wireless traffic during receive operations is typically discontinuous and random in nature, unlike most environmental or internally generated RFI. This can be exploited to detect and distinguish the RFI from the received traffic using, for example, minimum-hold and maximum-hold operations to generate RFI and traffic profiles, respectively.

Figure 1:
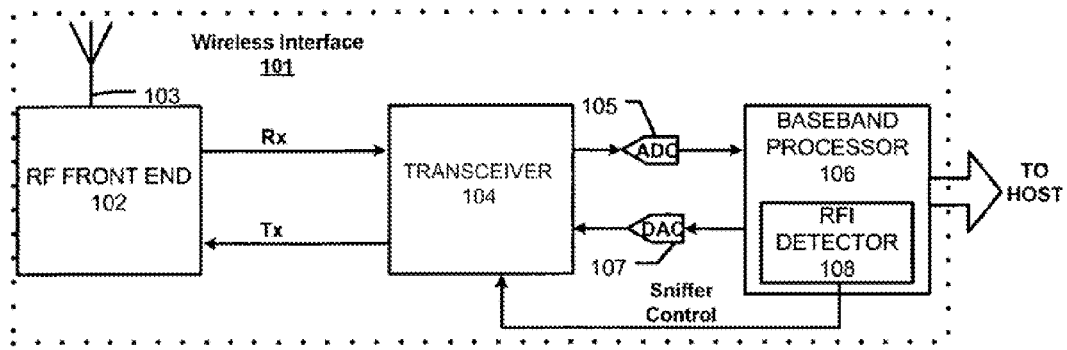
FIG. 1 is a diagram of a wireless interface having an RFI detector in accordance with some embodiments.

FIG. 1 is a diagram showing a wireless interface device 101 (e.g., a wireless network interface module) for coupling an electronic device such as a computer to a wireless network using a suitable methodology including but not limited to WiFi, WiMax, or the like. The depicted wireless interface generally comprises an RF front-end, 102, one or more antennas 103, transceiver 104, at least one A-to-D converter CADC) 105, at least one D-to-A converter (DAC) 107, and a baseband processor 106, coupled together as shown. It may support one or several different interface protocols to communicatively link a host (e.g., a processor in a computer) wirelessly to a network.

In this embodiment, the baseband processor has an RFI detector to identify and characterize RFI in accordance with the approaches discussed herein. The RFI detector uses the receiver portion of the interface to collect blocks of RF data, process it and generate from it RFI and data traffic profiles. It can do this during normal transmit/receive activity. (It should be appreciated that an RFI detector, as taught herein, may also be implemented elsewhere in the platform including but not limited to within the host itself.)

Figure 2:
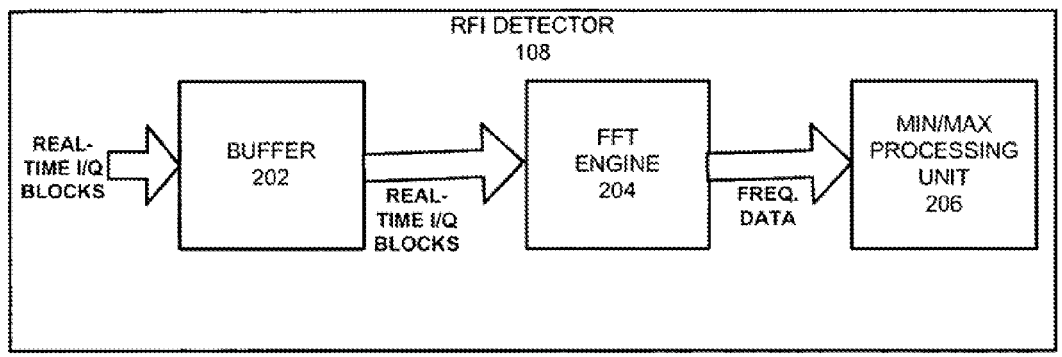
FIG. 2 is a diagram of an RFI detector in accordance with some embodiments.
Figure 3A:
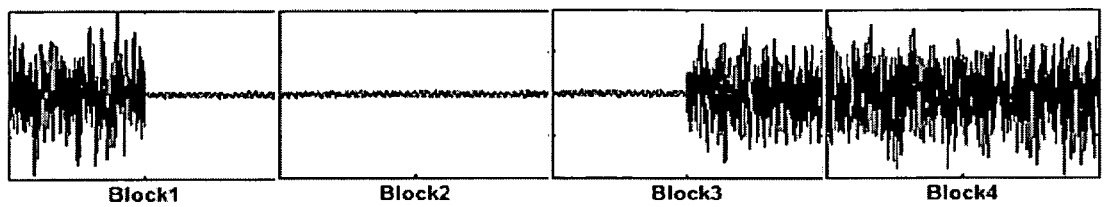
FIGS. 3A to 3C are signal diagrams illustrating RFI detection in accordance with some embodiments.

FIG. 2 is a diagram showing an RFI detector in accordance with some embodiments. The RFI detector generally comprises a buffer 202, a fast Fourier transform (FFT) engine 204, and a min./max. processing unit 206. The buffer 202 may comprise any suitable memory to store blocks of I and Q information collected from the receiver, e.g., from the A-to-D converter 105 from FIG. 1. The data is collected in blocks, e.g., two or more 20 µSec. blocks dictated by the sampling rate of the receiver, for a set defined number of sample points (e.g., 512) time-domain samples from the incoming traffic channel. FIG. 3A graphically depicts an exemplary, continuous real-time capture of data sampled into four blocks.

Figure 3B:
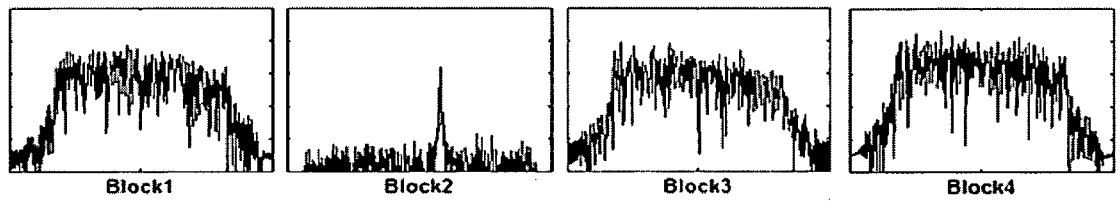

The FFT engine may be implemented with any suitable combination of hardware and software to convert the collected time-domain data into frequency-domain information. This is graphically represented in FIG. 3B, which shows the blocks from FIG. 3A converted into frequency information using an FFT methodology. In this example, the data is collected into 20 µSec blocks of 512 samples in each block. It should be appreciated that any suitable algorithm for performing a discrete Fourier transform (DFT), especially those to perform FFT, which is an efficient way to compute DFT, may be employed. Suitable FFT methods include but are not limited to Split-radix, Prime-factor, Bruun's, Rader's, and Bluestein's FFT algorithms to mention just a few.

Figure 3C:
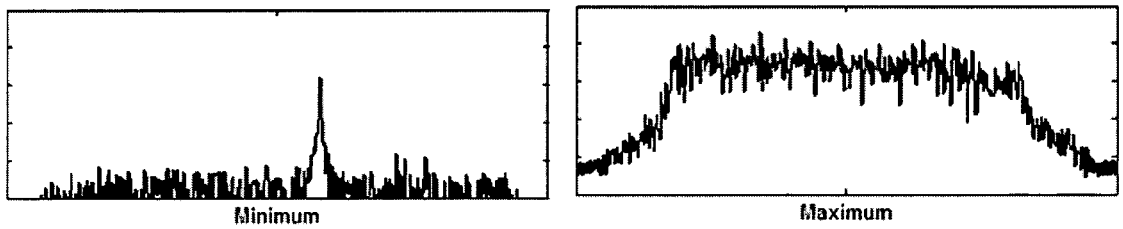

The data minimum and maximum processing unit 206 processes the frequency information to obtain minimum and maximum profiles to distinguish RFI from signal traffic. Min. and max profiles can be used to characterize RFI, as well as the traffic signal itself. The min. profile corresponds to the RFI, while the max. profile corresponds to the traffic signal. Min. (noise) and max. (traffic) profiles, for the detected (sniffed) RF data from FIG. 3A, are represented in FIG. 3C.

Any suitable approach may be used for obtaining these profiles. For example, min. hold and max. hold operations, whereby the smallest and largest value, respectively, for each block increment, is retained, could be employed to generate the min. and max. profiles. Other operations could be used. For example, averaging could also be used to generate a min. profile. With averaging, the values from the different blocks for each increment in the block are averaged to derive a resultant value for that block increment. Averaging operations may work well for methodologies using larger numbers of blocks and/or where blocks are collected over a relatively wide time frame. For example, some receivers may make available spaced apart blocks, e.g., every $n^{th}$ block.

Figure 4:
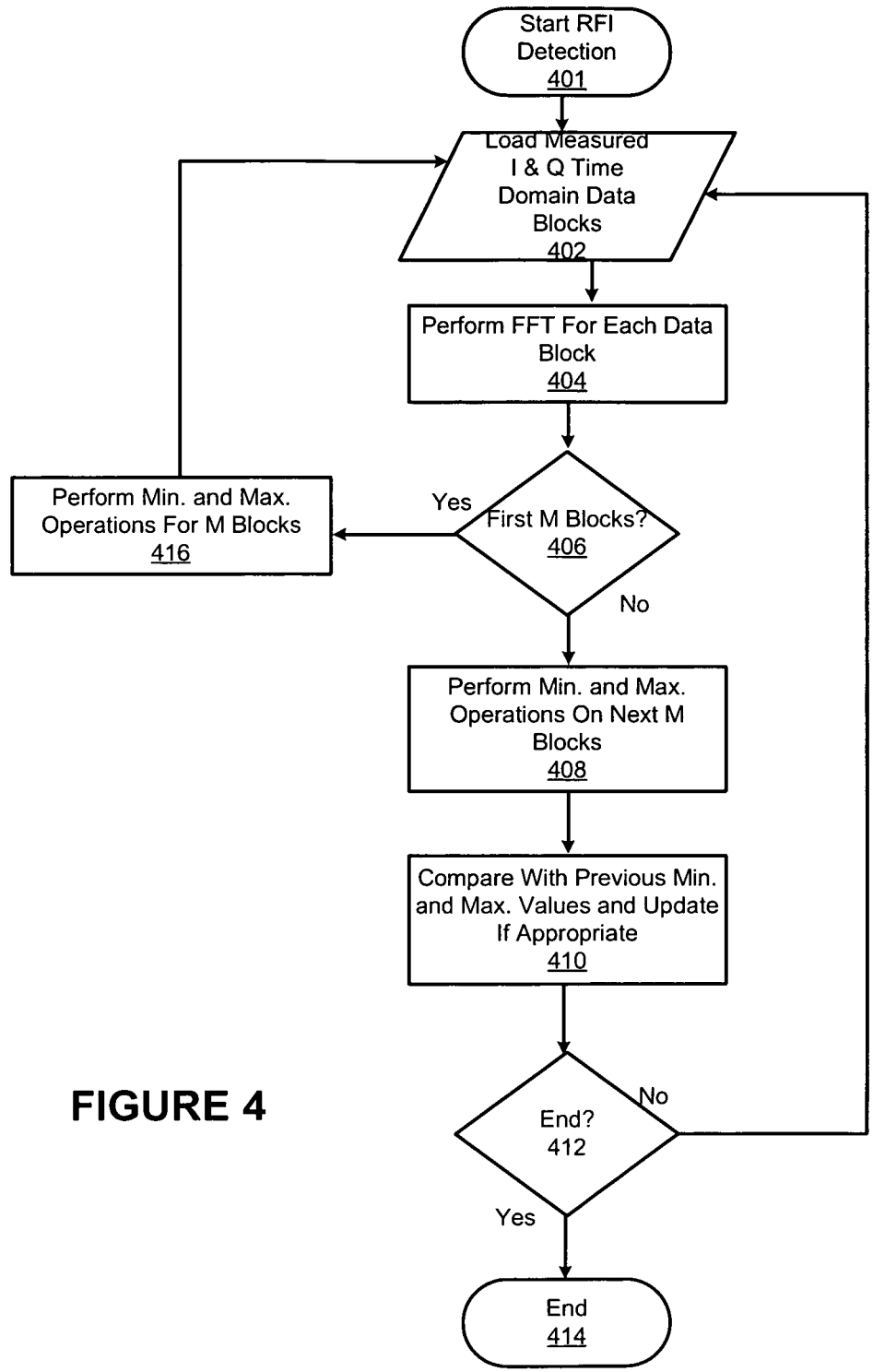
FIG. 4 is a flow diagram of a routine for detecting RFI in accordance with some embodiments.

FIG. 4 is a flow diagram showing a routine 401 for detecting RFI as discussed herein. At 402, M blocks of measured I and Q time domain data is loaded for processing by the FFT engine. The value of M could be any number and will typically depend on trade-offs between accuracy and efficiency, as well as on the implemented sniffer methodology. With the exemplary graphs of FIGS. 3A to 3C, for example, M was four. (Note that this routine works for different sniffer approaches. The sniffer may capture X blocks every time it is activated based on its memory allocation. Alternatively, it may capture information for a specific duration in time every time it is activated and process information simultaneously, making it both time and memory efficient, or it may be activated and start capturing information that is processed simultaneously until both the RFI and data transmission profiles are detected. This latter approach is energy-efficient in addition to being time and memory-efficient.)

At 404, the data blocks are converted from the time to the frequency domain using a FFT method. At 406, it determines if the M blocks are the first M blocks. If so, the routine proceeds to 416 and performs min. and max. operations on the frequency domain blocks to generate min. and max. profiles and then loops back to 402.

At 406, if the M blocks are not the first M blocks (i.e., min. and max. profiles have already been generated), it goes to 408 to perform min. and max. operations on the current blocks. At 410, it then compares the current min. and max. values with the previous ones for each block increment and updates the min. and max profiles if appropriate. That is, if the new min. value for a block increment is smaller than the previous one, it makes this newer value the min. value in the min. profile. At 412, it determines if it is to end. If not, it loops back to 402. Otherwise, it ends at 414.

Note that this routine can be used in a flexible manner. For example, in some systems, receivers are provided that have sniffer functionality whereby a certain number of blocks or skipped blocks, etc. are made available in response to sniffer invocation. With this in mind, it should be appreciated that the steps in this routine, e.g., describing loading blocks or the decision step regarding the first M blocks, are meant to cover any group of blocks, regardless of whether they are sequentially adjacent, spaced apart, covering large or small time spans, etc.

Thus, the undesired RF emission or radio frequency interference (RFI) can be identified in conjunction with nominal receiver operation or a dedicated operation through the use of little information (2 blocks of I & Q data) in memory for identification/detection of RFI, making it time, power, and memory efficient. In addition, as discussed more below, in some embodiments, the attained noise information (e.g., SNR, RSSI information) can be used as an active-channel penalty function in an RFI mitigation scheme.

Figure 5:
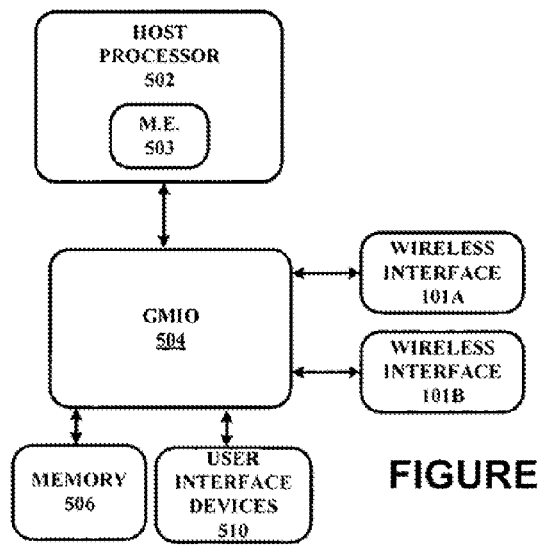
FIG. 5 is a block diagram of a computer system having an RFI mitigation engine in accordance with some embodiments.

With reference to FIG. 5, one example of a portion of a computing platform is shown. The computing platform may implement a variety of different computing devices or other appliances with computing capability. Such devices include but are not limited to laptop computers, notebook computers, personal digital assistant devices (PDAs), cellular phones, audio and/or video media players, desktop computer, servers, and the like. The represented portion comprises one or more processors 502, graphics/memory/input/output (GMIO) control 504, memory 506, wireless interface devices 101A, 101B, and user interface devices 510. The processor(s) 502 is coupled to the memory 506, wireless interface devices 101A, B, and user interface devices 510 through the GMIO control 504. The GMIO control 504 may comprise one or more blocks (e.g., chips or units within an integrated circuit) to perform various interface control functions (e.g., memory control, graphics control, I/O interface control, and the like. These circuits may be implemented on one or more separate chips and/or may be partially or wholly implemented within the processor(s) 502.

The memory 506 comprises one or more memory blocks to provide additional random access memory to the processor(s) 502. It may be implemented with any suitable memory including but not limited to dynamic random access memory, static random access memory, flash memory, or the like. The wireless interface devices 101A,B wirelessly couple the processor(s) 502 to wireless networks (not shown). They may be implemented with any suitable devices, e.g., off-the-shelf network interface cards (NICs), modules made specifically for the computing platform, or they may be integrated into the platform such as by being part of the GMIO 504. In the depicted example, they are implemented with wireless interface devices 101 described in FIG. 1. They may include an RFI detector, or alternatively, the RFI detector may be implemented across different blocks including the processor and the wireless interface devices.

The user interface devices 510 comprise one or more devices such as a display, keypad, mouse, etc. to allow a user to interact with and perceive information from the computing platform.

The processing unit(s) 502 comprises a mitigation engine 503 to reduce the adverse effects of RFI generated by RFI sources on the platform that are tone shiftable, i.e., their fundamental frequency can be shifted. Such RFI sources could include but are not limited to clocks, including host and interface clocks that may be spectrum spread or not spread, and data strobe signals. In some embodiments, the mitigation engine 503 monitors affected wireless channels in the wireless interface devices 101A, B for RFI (caused by the shiftable noise sources) and traffic to adaptively shift noise source harmonics, either out of the active channels or to a less interfering position within the active channel(s) using cost-function analysis. The mitigation engine 503 may be implemented using processing resources within the processor 502, or it may be implemented with task specific circuitry, within and/or external to the processor. With multi-core processors or multi-processor platforms, it may be implemented in one of the processors, cores or a combination of multiple processing cores.

Figure 6:
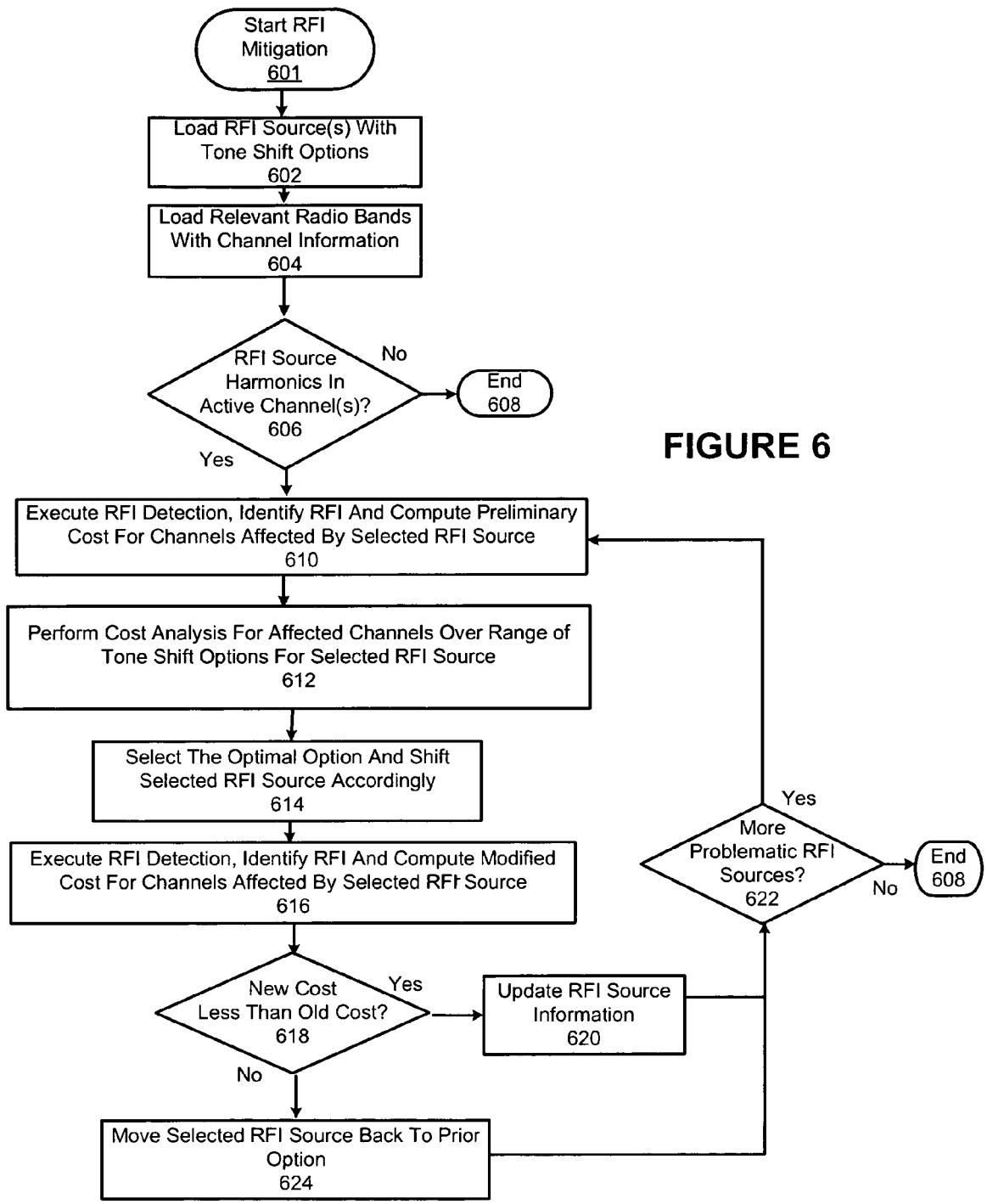
FIG. 6 is a flow diagram of a routine for mitigating RFI in accordance with some embodiments.

FIG. 6 shows a flow diagram of a routine 601 for implementing a mitigation engine in accordance with some embodiments. Reference is also made to graphs in FIGS. 7A to 7E, which are used in cooperation with the flow diagram for better understanding of the methodology.

At 602, RFI source information for controllable RFI sources are loaded. For example, various different platform clocks for clocks that are tone shiftable are loaded, along with their tone shift options. Similarly, at 604, radio band information for relevant wireless device(s) on the platform are also loaded.

At 606, the routine determines, e.g., computes, if problematic harmonics from the loaded RFI sources are in any of the active RF bands or band channels. This is done based on the RFI source default center frequency settings (or on known or expected spectrums for spread spectrum clocks). Depending on design considerations, signal qualities, strengths, and the like, different degrees of harmonics may or may not be considered. Along these lines, thresholds may be used in assessing whether or not a harmonic is problematic. If there are no determined (e.g., calculated) problematic RFI harmonics in any active channels, then the routine ends at 608. On the other hand, if there are any problematic harmonics, then it proceeds to 610 and executes (or initiates) an RFI detection, such as the RFI detection previously discussed, for the active channels implicated by a selected RFI source. (Note that an RFI source may generate numerous harmonics that could affect one or more active channels.)

Figure 7A:
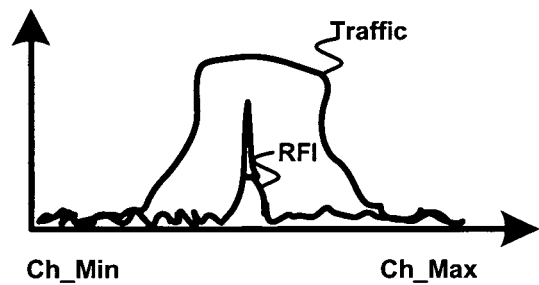
FIGS. 7A to 7E graphically depict various tasks of the routine of FIG. 6 in accordance with some embodiments.
Figure 7B:
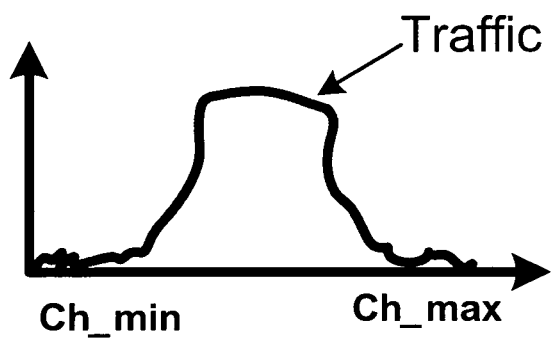
Figure 7C:
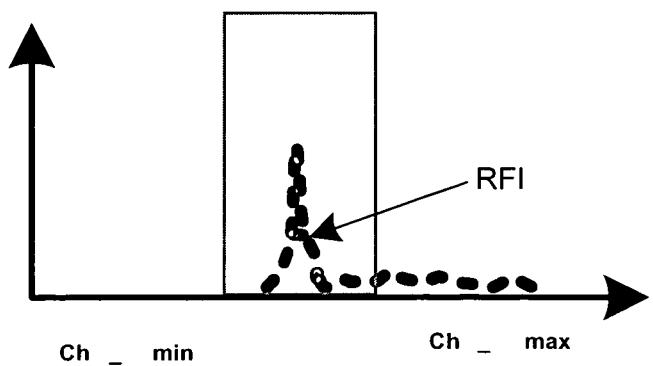

For each affected channel, it acquires traffic and RFI profiles for the channel(s) implicated by the selected RFI source. This is illustrated at FIG. 7A for one channel. It separates the traffic and RFI into two separate functions:

(i) $$\left|\sum_{m=1}^{M} \prod_{m} \left(\frac{\omega_{c,m} - \omega}{\omega_{bw,m}}\right)\right|,$$

where $\pi_m$ defines shape of the penalty function for the $m^{th}$ active channel (M is the total number of identified active channels), $\omega_{c,m}$ is the center frequency of the $m^{th}$ active channel, and $\omega_{bw,m}$ is the bandwidth (frequency range) of the $m^{th}$ frequency channel, and (ii) $$\sum_{n=1}^{N_p} A_{p,n} \Gamma_p\left(\frac{n\omega_{0,p} - \omega}{n\varphi_{bw,p}}\right),$$

where $A_{p,n}$ is the amplitude of the $n^{th}$ harmonic of the $p^{th}$ clock, $N_p$ is the total number of clocks, $\omega_{0,p}$ is the fundamental frequency of the $p^{th}$ clock, $\omega_{bw,p}$ is the bandwidth of the spread of the $p^{th}$ clock, and $\Gamma_p$ defines the spreading function for the $p^{th}$ clock, respectively), as is graphically represented at FIGS. 7B and 7C. Thus, a traffic function and an RFI function are obtained and available for cost analysis.

Further more the RFI is identified to be due to a specific source from the platform (e.g., platform clock) and its with respect to its noise floor or radio receiver sensitivity is assessed for using any other numerical analysis approach (e.g. A windowing feature).

Figure 7D:
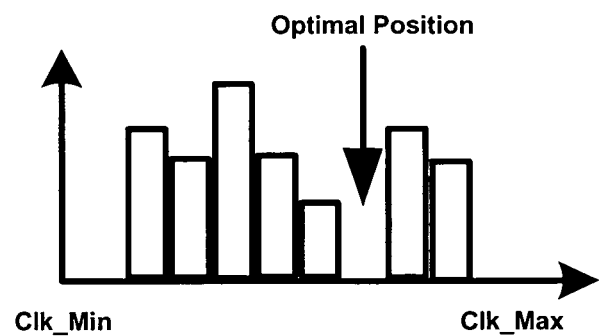
Figure 7E:
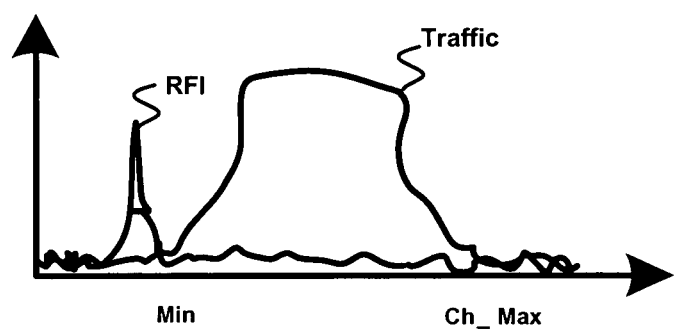

With this information, it calculates a preliminary cost for each affected channel. For example, this may be done by convoluting the traffic profile against the identified RFI profile for each channel, e.g., using the enhanced formula shown below: to obtain a measure (or quantity) indicative of the impact of the RFI on all radio channels.

$$C(\omega_0, \varphi_{bw}) = \int \sum_{p=1}^{P} \left[\frac{\sum_{n=1}^{N_p} A_{p,n} \Gamma_p\left(\frac{n\omega_{0,p} - \omega}{n\varphi_{bw,p}}\right)}{\text{Max}\left(\sum_{n=1}^{N_p} A_{p,n} \Gamma_p\left(\frac{n\omega_{0,p} - \omega}{n\varphi_{bw,p}}\right)\right)}\right] \times \left[\frac{\sum_{m=1}^{M} \prod_m \left(\frac{\omega_{c,m} - \omega}{\omega_{bw,m}}\right)}{\text{Max}\left(\sum_{m=1}^{M} \prod_m \left(\frac{\omega_{c,m} - \omega}{\omega_{bw,m}}\right)\right)} \frac{1}{\omega_{bw,m}}\right] d\omega$$

where,
$A_{p,n}$ is the amplitude of the $n^{th}$ harmonic of the $p^{th}$ clock
$\omega_{0,p}$ is the fundamental frequency of the $p^{th}$ clock
$\pi_m(x)$ is the penalty profile for the $m^{th}$ frequency channel
$\Gamma_p(x)$ is the spread profile for the $p^{th}$ clock
$\omega_{c,m}$ is the center frequency of the $m^{th}$ frequency channel, and $\omega_{bw,m}$ is the bandwidth of the $m^{th}$ frequency channel
$\varphi_{bw,p}$ is the bandwidth of the $p^{th}$ clock Next, at 612, the estimated cost for the all affected radio bands, as discussed is computed, for all frequency options listed for the a selected RFI source which is graphically represented in the bar graph of FIG. 7D. From this the clock option that minimizes RFI impact for the different active radio bands is chosen. At 614, the routine controls the selected RFI source (e.g., clock) to shift its frequency to this identified "optimal" option that minimizes impact on the affected bands.

At 616, it again initiates RFI detection for the active bands, e.g., as done previously at 610 and computes a modified cost based on this detection. At 618, it confirms that the modified cost is less than the preliminary cost. If it is not, then at 624, it changes the RFI source frequency (tone) back to its previous value, e.g., default value and proceeds to 622. On the other hand, if the tone changes did reduce cost (RFI impact), then at 620, it updates its current RFI source information to account for its new operating center frequency and proceeds to 622. Here, it determines if there is another RFI source (e.g., clock) to evaluate. If so, then it loops back to 610 and repeats the routine as described for the new selected RFI source. On the other hand, if there is not another RFI source, then it ends at 608.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate mote constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit.

Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. An electronic apparatus, comprising:
    one or more wireless interface devices; and
    a processing unit to detect radio frequency interference (RFI), the processing unit to:
        detect frequency maximums corresponding to wireless traffic,
        detect frequency minimums corresponding to RFI from one or more RFI sources, and
        control one or more tone shiftable RFI sources, in response to detecting RFI from the sources, to reduce their presence in active RF bands of the one or more wireless interface devices using a cost-function analysis, wherein the cost-function analysis includes a measure indicative of the impact of the RFI on all active radio channels as a whole, and wherein a frequency of the one or more tone shiftable RFI sources is selected that minimizes impact on all the affected bands as a whole.

2. The apparatus of claim 1, in which the processing unit is to determine a channel cost for the active RF bands for different RFI source tone shift options.

3. The apparatus of claim 2, in which the channel cost is based on a convolution of detected RFI and detected traffic profiles.

4. The apparatus of claim 3, in which separate channel cost analysis is to be done separately for each RFI source or cumulatively.

5. The apparatus of claim 4, in which the bands are RFI detected again to confirm that RFI impact was decreased.

6. The apparatus of claim 1, in which the one or more tone shiftable sources comprises a system clock or a data strobe.

7. The apparatus of claim 1, in which the processing unit is implemented in a processor chip.

8. The apparatus of claim 1, in which the cost-function analysis is to:
    determine a preliminary cost for each affected channel;
    select a clock frequency that minimizes RFI source impact for all affected bands as a whole;
    determine a modified cost based on the selected clock frequency; and
    determine whether the modified cost is less than the preliminary cost, and if not, change the RFI source frequency back to a previous value.

9. A computer system, comprising:
    a processor;
    a mitigation engine to detect a radio frequency interference (RFI); and
    at least one wireless interface device to operate over one or more active channels, the mitigation engine to:
        generate a traffic profile over the one or more active channels based on frequency maximums, and
        generate an RFI profile of the one or more active channels based on frequency minimums related to one or more RFI sources over the one or more active channels, and
        shift one or more RFI sources based on the detection and a cost-function analysis, wherein the cost-function analysis includes a measure indicative of the impact of the RFI on all active radio channels as a whole, and wherein a frequency of the one or more tone shiftable RFI sources is selected that minimizes impact on all the affected bands as a whole.

10. The system of claim 9, in which the mitigation engine is to again detect RFI after shifting the one or more RFI sources to confirm that RFI impact was reduced.

11. The system of claim 9, in which the one or more RFI sources comprises one or more system clocks.

12. The system of claim 9, wherein the mitigation engine is implemented in the processor.

13. The system of claim 9, in which the processor is part of a system on chip.

14. The system of claim 9, in which the cost-function analysis is to:
    determine a preliminary cost for each affected channel;
    select a clock frequency that minimizes RFI source impact for all affected bands as a whole;
    determine a modified cost based on the selected clock frequency; and
    determine whether the modified cost is less than the preliminary cost, and if not, change the RFI source frequency back to a previous value.

15. A method, comprising:
    determining if a radio frequency interference (RFI) source generates one or more RFI harmonics in an active channel;
    detecting RFI for the channel by:
        generating a traffic profile of the channel based on frequency maximums, and
        generating a RFI profile of the channel based on frequency minimums corresponding to one or more RFI sources; and
    comparing an RFI impact on the channel for different RFI source tone shift options using the traffic and RFI profiles, wherein the RFI impact is a measure indicative of the impact of the RFI on all active radio channels as a whole; and
    selecting a frequency of the one or more tone shiftable sources that minimizes impact on all the affected bands as a whole.

16. The method of claim 15, in which detecting RFI comprises performing maximum and minimum hold operations.

17. The method of claim 15, in which comparing RFI impact comprises estimating a cost for each tone option.

18. The method of claim 15, in which the RFI source is a clock in a processor.

19. The method of claim 15, comprising shifting the RFI source tone to minimize RFI impact on the channel.

20. The method of claim 15, in which RFI impact is compared for different RFI sources at their multiple tone options.

\* \* \* \* \*